(12) United States Patent
Iwasaka et al.

(10) Patent No.: US 9,187,256 B2
(45) Date of Patent: Nov. 17, 2015

(54) NON-CONTACTING CONVEYANCE EQUIPMENT

(75) Inventors: Hitoshi Iwasaka, Kofu (JP); Hideyuki Tokunaga, Kofu (JP); Katsuhiro Koshiishi, Kofu (JP)

(73) Assignee: HARMOTEC CO., LTD., Kofu (JP)

( * ) Notice: Subject to any disclaimer, the term of this patent is extended or adjusted under 35 U.S.C. 154(b) by 0 days.

(21) Appl. No.: 14/117,499

(22) PCT Filed: Aug. 24, 2012

(86) PCT No.: PCT/JP2012/071446
§ 371 (c)(1),
(2), (4) Date: Nov. 13, 2013

(87) PCT Pub. No.: WO2013/027828
PCT Pub. Date: Feb. 28, 2013

(65) Prior Publication Data
US 2014/0227045 A1    Aug. 14, 2014

(30) Foreign Application Priority Data
Aug. 24, 2011    (JP) .................. 2011-182978

(51) Int. Cl.
*H01L 21/683* (2006.01)
*B65G 25/00* (2006.01)
*H01L 21/687* (2006.01)

(52) U.S. Cl.
CPC ............ *B65G 25/00* (2013.01); *H01L 21/6838* (2013.01); *H01L 21/68707* (2013.01); *H01L 21/68728* (2013.01)

(58) Field of Classification Search
CPC .................. H01L 21/6838; H01L 21/68707; H01L 21/68728; Y10S 414/141; B65G 47/911; B65G 25/00
USPC ........ 294/64.3, 188, 213, 64.2, 185; 414/941; 901/40
See application file for complete search history.

(56) References Cited

U.S. PATENT DOCUMENTS 6,322,116 B1 * 11/2001 Stevens ................. 294/64.3
7,360,322 B2 * 4/2008 Iwasaka et al. .......... 34/576
(Continued)

FOREIGN PATENT DOCUMENTS

JP    A-2005-51260    2/2005
JP    A-2005-142462    6/2005
(Continued)

OTHER PUBLICATIONS

Sep. 18, 2012 International Search Report issued in International Application No. PCT/JP2012/071446.
(Continued)

*Primary Examiner* — Gabriela Puig
(74) *Attorney, Agent, or Firm* — Oliff PLC

(57) ABSTRACT

Non-contacting conveyance equipment for conveying a plate-like member in a non-contacting manner comprises a plate-like base body and a plurality of swirl flow-forming bodies provided at the base body. Each of the plurality of swirl flow-forming bodies includes a column-shaped main body, a cylindrical chamber formed inside the main body, that has an opening at one end, a flat end face formed at a surface of the main body, in which the cylindrical chamber is opened, a jetting port provided at an inner circumferential surface of the cylindrical chamber, a fluid introduction port provided at an outer circumferential surface of the main body, and a fluid passage that connects the fluid introduction port to the jetting port.

1 Claim, 11 Drawing Sheets

(56) References Cited

U.S. PATENT DOCUMENTS

| | | | |
|---|---|---|---|
| 7,611,182 B2* | 11/2009 | Kim et al. | 294/103.1 |
| 7,926,494 B2* | 4/2011 | Child | 134/145 |
| 2004/0206304 A1* | 10/2004 | Menear | 118/500 |
| 2006/0113719 A1* | 6/2006 | Nagai et al. | 269/20 |
| 2006/0290151 A1* | 12/2006 | Akiyama | 294/64.1 |
| 2010/0270452 A1* | 10/2010 | Hoshino et al. | 248/363 |

FOREIGN PATENT DOCUMENTS

| | | |
|---|---|---|
| JP | A-2007-176637 | 7/2007 |
| JP | A-2007-216329 | 8/2007 |
| WO | WO 2007074855 A1 * 7/2007 | B65G 49/06 |
| WO | 2010004800 A1 1/2010 | |

OTHER PUBLICATIONS

Feb. 24, 2015 Search Report issued in European Patent Application No. 12825546.0.

May 12, 2015 Office Action issued in Japanese Patent Application No. 2013-530072.

Jul. 20, 2015 Office Action issued in Korean Patent Application No. 10-2014-7003338.

* cited by examiner

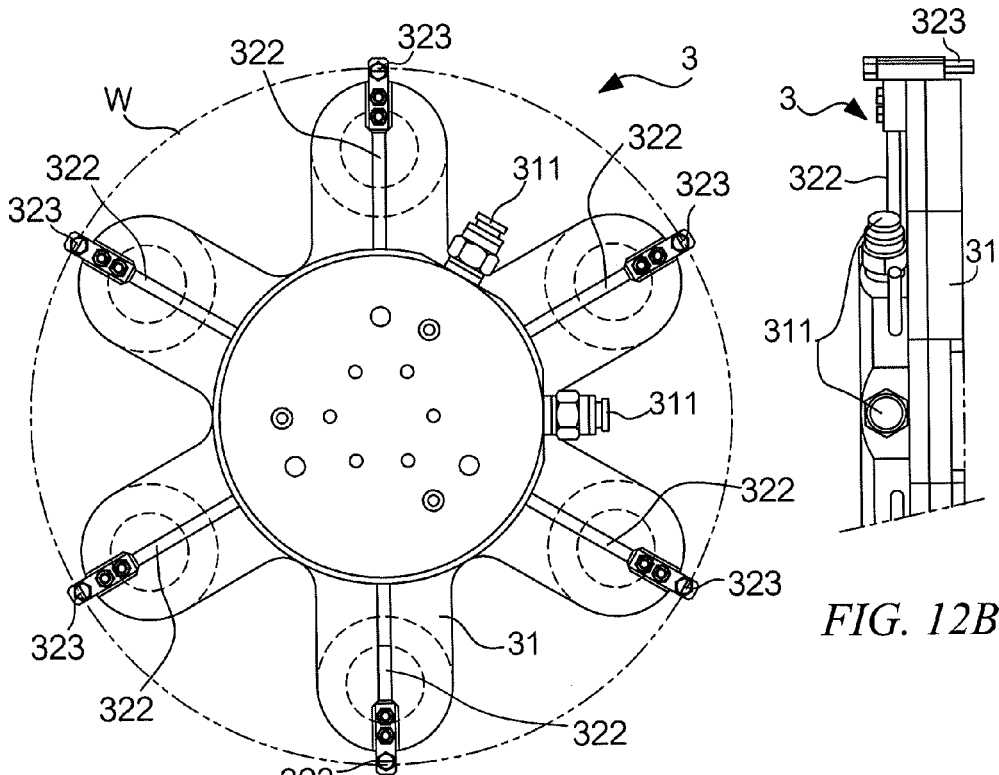
FIG. 12A
FIG. 12B
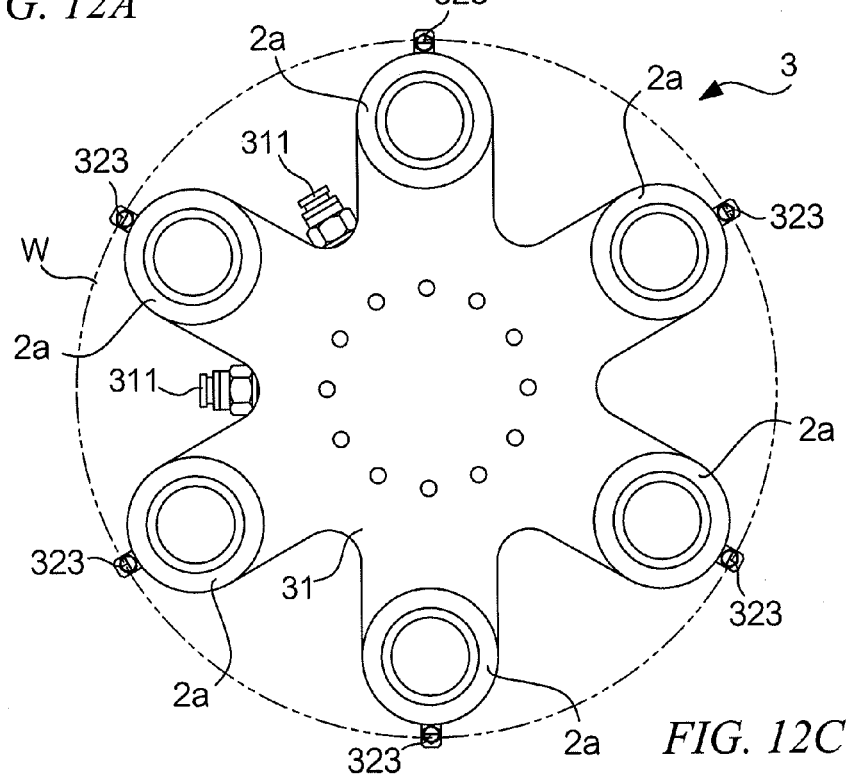
FIG. 12C

NON-CONTACTING CONVEYANCE EQUIPMENT

TECHNICAL FIELD

The present invention relates to non-contacting conveyance equipment.

BACKGROUND ART

In recent years, equipment for conveying a plate-like member such as a semiconductor wafer or a glass substrate in a non-contacting manner has been developed. For example, in Patent Document 1, equipment is proposed for conveying a plate-like member in a non-contacting manner, by applying Bernoulli's theory. In the equipment, a swirl flow is generated in a cylindrical chamber that opens on the underside of the equipment, and a negative pressure generated in the center of the swirl flow exerts suction on a plate-like member. On the other hand, a given distance is maintained between the equipment and the plate-like member by a fluid flowing out of the cylindrical chamber. Consequently, the plate-like member is conveyed in a non-contacting manner.

PRIOR ART DOCUMENT

Patent Document

Patent Document 1: JP 2005-51260 A1

SUMMARY OF THE INVENTION

Problems to be Solved by the Invention

It is an object of the present invention to suppress rotation of a plate-like member, which is caused when the plate-like member is conveyed in a non-contacting manner.

Means for Solving the Problems

The present invention provides non-contacting conveyance equipment for conveying a plate-like member in a non-contacting manner, comprising: a plate-like base body; and a plurality of swirl flow-forming bodies provided at the base body, wherein each of the plurality of swirl flow-forming bodies includes: a column-shaped main body; a cylindrical chamber formed inside the main body, that has an opening at one end; a flat end face formed at a surface of the main body, on which the cylindrical chamber is opened; a jetting port provided at an inner circumferential surface of the cylindrical chamber; a fluid introduction port provided at an outer circumferential surface of the main body; and a fluid passage that connects the fluid introduction port to the jetting port, wherein the fluid passage is arranged so that a direction in which a fluid flows out of the cylindrical chamber along the end face is substantially parallel to a line that extends from a center of gravity of the plate-like member being conveyed, toward an outer circumference of the plate-like member.

Effects of the Invention

According to the present invention, it is possible to suppress rotation of a plate-like member, which is caused when the plate-like member is conveyed in a non-contacting manner, as compared with a case where a fluid passage is arranged so that a direction in which a fluid flows out of a cylindrical chamber of a swirl flow-forming body along an end face of the chamber is not substantially parallel to a line that extends from the center of gravity of a plate-like member being conveyed toward the outer circumference of the member.

BRIEF DESCRIPTION OF THE DRAWINGS

FIG. 12 shows a top view, a side view, and a bottom view of non-contacting conveyance equipment 3.

FIG. 17 is a diagram showing directions in which a fluid flows out of swirl flow-forming bodies 2a.

MODES FOR IMPLEMENTING THE INVENTION

Embodiments of the present invention will be described below with reference to the drawings.

(1) First Embodiment

Figure 1:
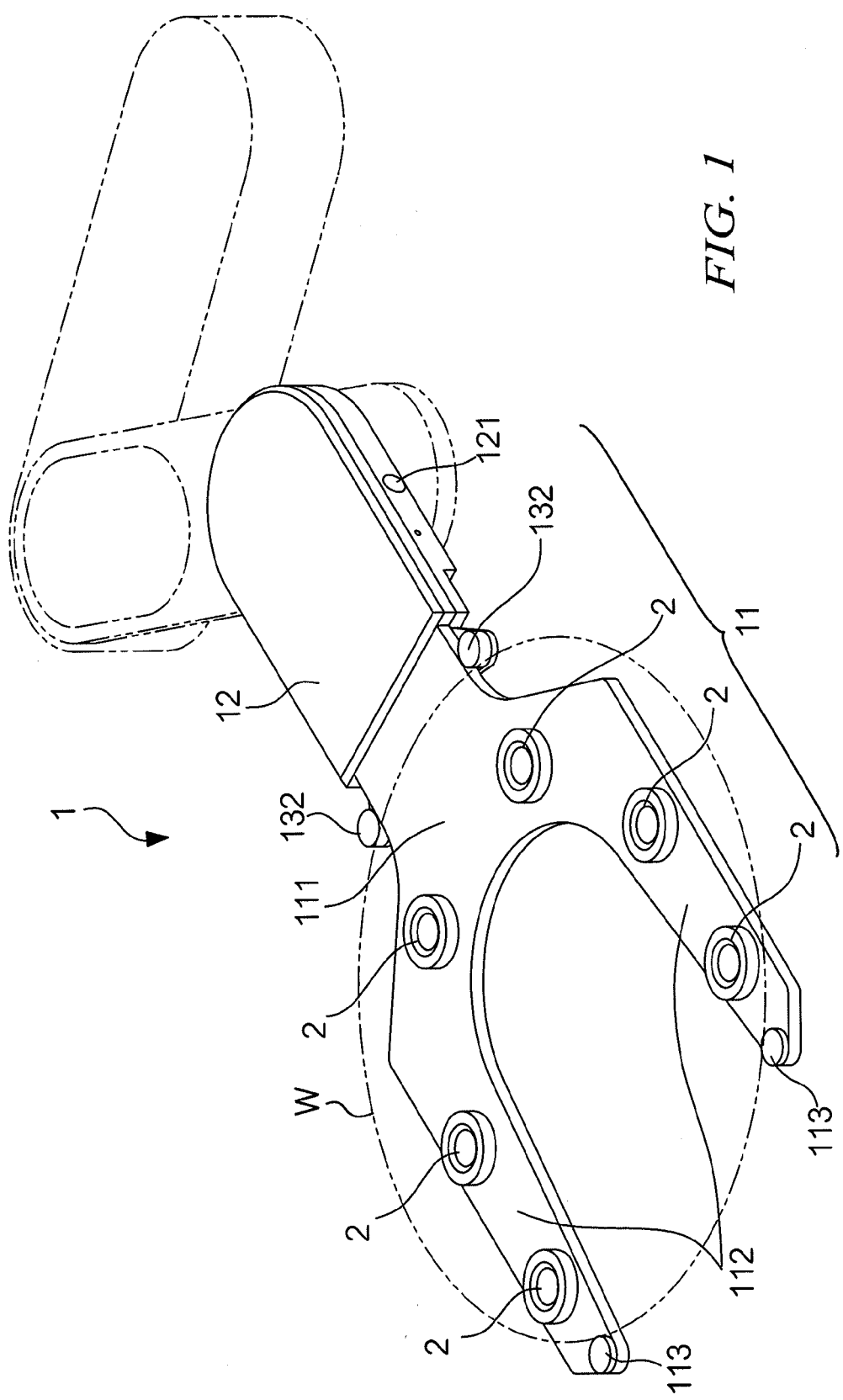
FIG. 1 is a perspective view showing a configuration of non-contacting conveyance equipment 1 according to the first embodiment of the present invention.
Figures 2A, 2B:
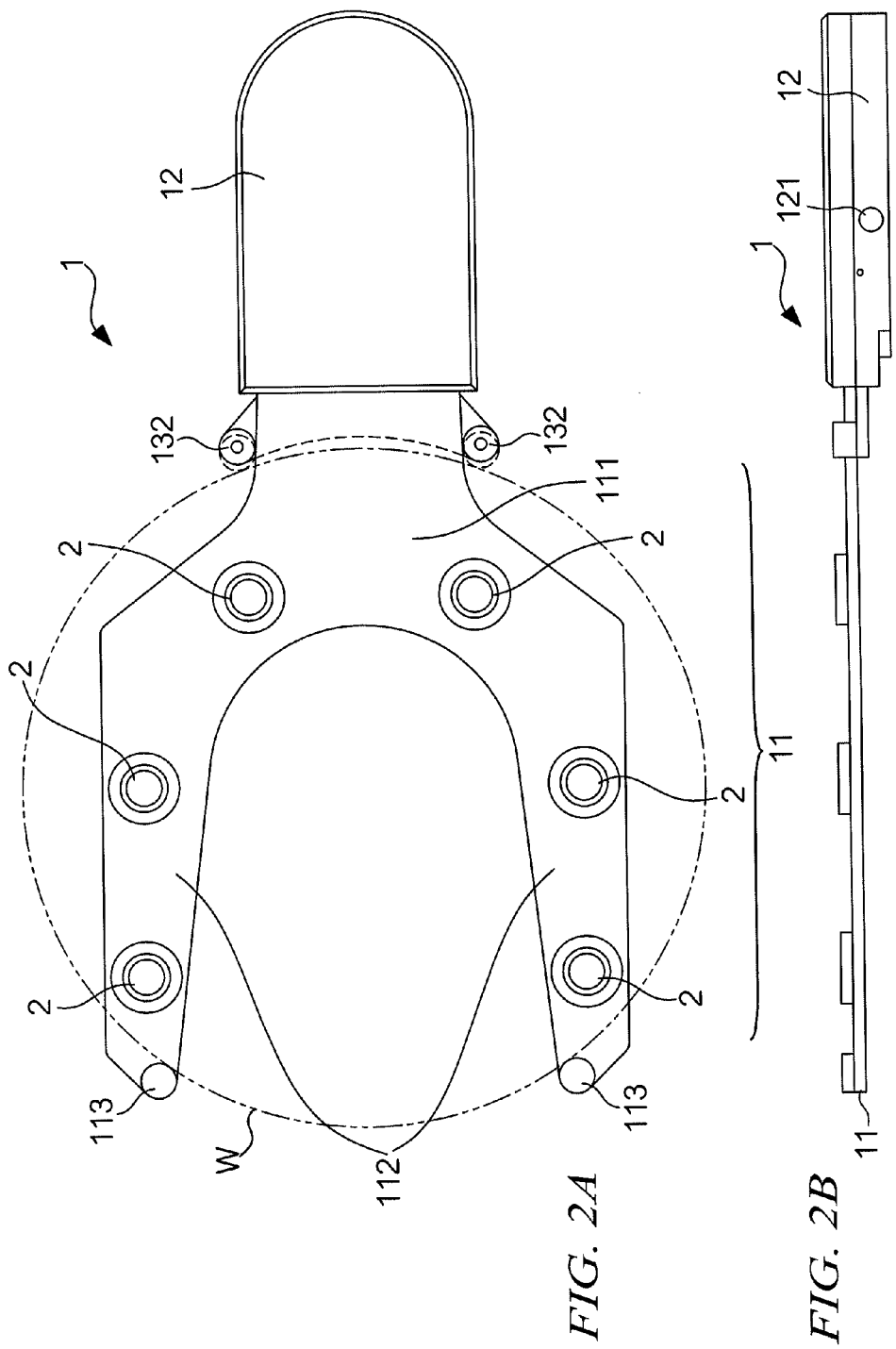
FIG. 2 shows a top view and a side view of non-contacting conveyance equipment 1.
Figure 3:
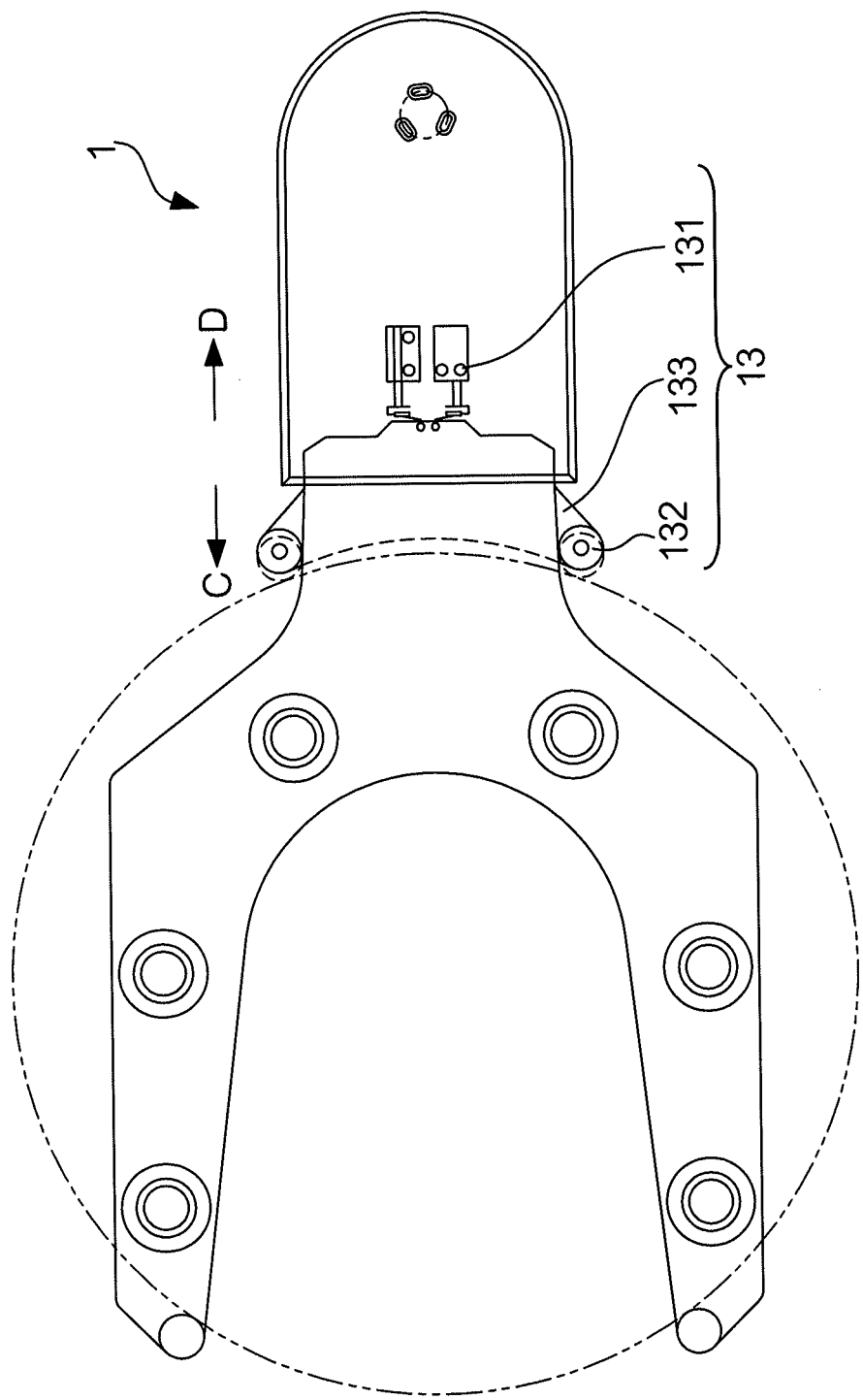
FIG. 3 is a diagram illustrating centering mechanism 13 provided in non-contacting conveyance equipment 1.

FIG. 1 is a perspective view showing a configuration of non-contacting conveyance equipment 1 according to the first embodiment of the present invention. FIG. 2(a) is a top view of non-contacting conveyance equipment 1, and FIG. 2(b) is a side view of non-contacting conveyance equipment 1. FIG. 3 is a diagram illustrating centering mechanism 13 provided in non-contacting conveyance equipment 1. Non-contacting conveyance equipment 1 is equipment for holding and conveying plate-like member W, such as a semiconductor wafer or a glass substrate, in a non-contacting manner.

Non-contacting conveyance equipment 1 includes: plate-like base body 11; six swirl flow-forming bodies 2, which are fixed on base body 11 and have a column shape; holding part 12, which is held to move base body 11; and centering mechanism 13 for positioning plate-like member W. Base body 11 includes rectangular base part 111 and two arm parts 112 that extend forkedly from base part 111. At the tip of each arm part 112, column-shaped centering guide 113 is fixed.

Figure 4:
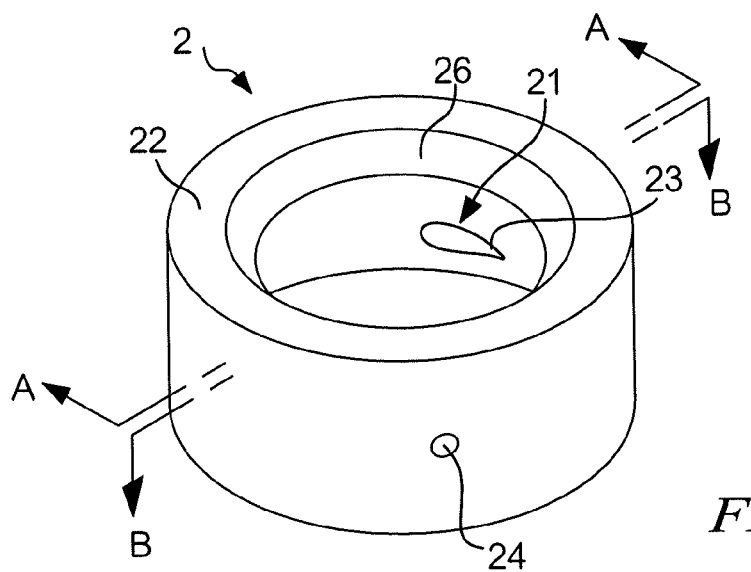
FIG. 4 is a perspective view of a configuration of swirl flow-forming body 2 according to the first embodiment.
Figure 5:
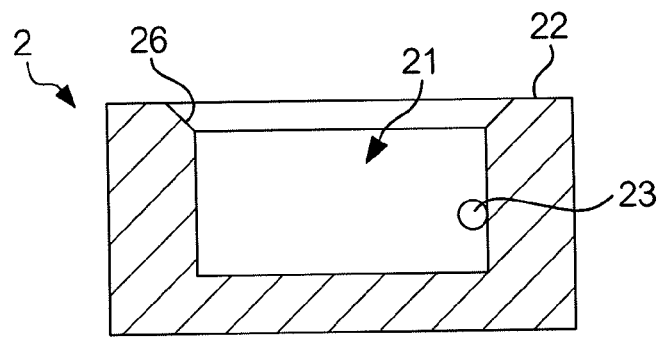
FIG. 5 is a cross-sectional view of swirl flow-forming body 2 along the line A-A of FIG. 4.
Figure 6:
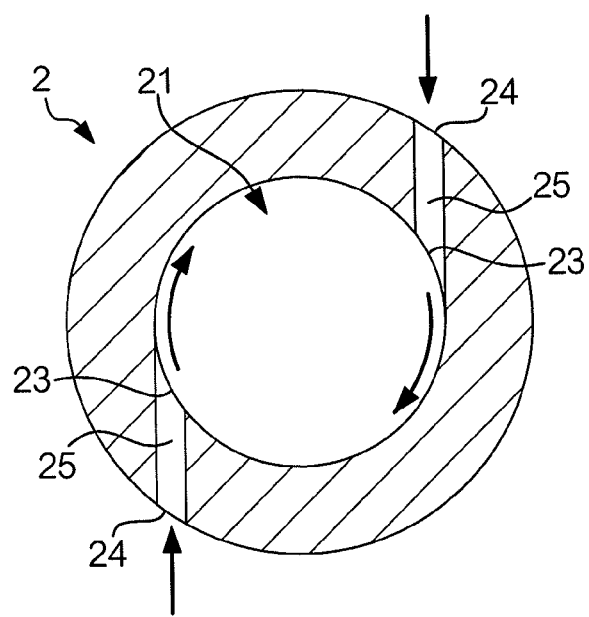
FIG. 6 is a cross-sectional view of swirl flow-forming body 2 along the line B-B of FIG. 4.

FIG. 4 is a perspective view of a configuration of swirl flow-forming body 2. FIG. 5 is a cross-sectional view of swirl flow-forming body 2 along the line A-A of FIG. 4. FIG. 6 is a cross-sectional view of swirl flow-forming body 2 along the line B-B of FIG. 4. Inside swirl flow-forming body 2, cylindrical chamber 21 that includes a column-shaped space and has an opening at one end, is formed. At a surface of swirl flow-forming body 2 at which the cylindrical chamber 21 is opened, flat end face 22 is formed. At the inner circumferential surface of cylindrical chamber 21, two jetting ports 23 are formed, and at the outer circumferential surface of swirl flow-forming body 2, two fluid introduction ports 24 are formed. Jetting port 23 and fluid introduction port 24 are connected via fluid passage 25. Two fluid passages 25 are arranged so that they are parallel to each other. At the opening edge of cylindrical chamber 21, slope 26 is formed.

A face of swirl flow-forming body 2 opposite end face 22 is fixed on base part 111 or arm part 112. A height from base part 111 or arm part 112 to end face 22 of each swirl flow-forming body 2 is the same.

At a side surface of holding part 12, fluid supply port 121 is provided. Inside base body 11, fluid passages (not shown) that connect fluid supply port 121 to fluid introduction ports 24 of each swirl flow forming body 2, are formed.

Centering mechanism 13 is provided under base body 11, which positions plate-like member W being held in a non-contacting manner, and prevents plate-like member W from falling off non-contacting conveyance equipment 1. Centering mechanism 13, as shown in FIG. 3, includes cylinders 131 and ring plate 133. Cylinders 131 are provided inside holding part 12. An end of ring plate 133 is coupled to cylinders 131. At the other end of ring plate 133, two column-shaped centering guides 132 are fixed. When pressure is applied to cylinders 131 by use of a fluid provided by a fluid supply apparatus (not shown); centering guides 132 move in the direction of arrow C, shown in FIG. 3. When cylinders 131 are depressurized, centering guides 132 move in the direction of arrow D shown in FIG. 3.

In non-contacting conveyance equipment 1 described in the foregoing, when a fluid (for example, air) is supplied via fluid supply port 121 from a fluid supply apparatus (not shown), the fluid is sent to fluid introduction ports 24 of each swirl flow-forming body 2 through fluid passages (not shown) formed inside base body 11. The fluid sent to fluid introduction ports 24 travels through fluid passage 25, and is discharged into cylindrical chamber 21 via jetting port 23. The fluid discharged into cylindrical chamber 21 forms a swirl flow and is straightened in cylindrical chamber 21, and thereafter flows out from the opening of cylindrical chamber 21.

In that situation, if plate-like member W is positioned opposite end face 22, flow of outside air into cylindrical chamber 21 is restricted. In addition, since a centrifugal force of the swirl flow develops, and entrainment is generated, fluid molecules per unit volume in the center of the swirl flow become less dense; namely, a negative pressure is generated. As a result, plate-like member W is pushed toward end face 22 by surrounding air. On the other hand, as plate-like member W comes close to end face 22, an amount of air flowing out of cylindrical chamber 21 decreases, and a velocity of a fluid discharged into cylindrical chamber 21 through jetting port 23 decreases, so that a pressure in the center of the swirl flow increases. Accordingly, plate-like member W does not come into contact with end face 22, and a given distance is maintained between plate-like member W and end face 22.

In the situation where plate-like member W is held by non-contacting conveyance equipment 1, if pressure is applied to cylinders 131 of centering mechanism 13, centering guides 132 move in the direction of arrow C shown in FIG. 3. Consequently, plate-like member W is moved by centering guides 132 in the direction of arrow C shown in FIG. 3 so that the outer circumference of plate-like member W is regulated by centering guides 113 and centering guides 132 (namely, plate-like member W is positioned). On the other hand, if cylinders 131 are depressurized, centering guides 132 move in the direction of arrow D shown in FIG. 3 so that regulation of plate-like member W is terminated.

Figure 7:
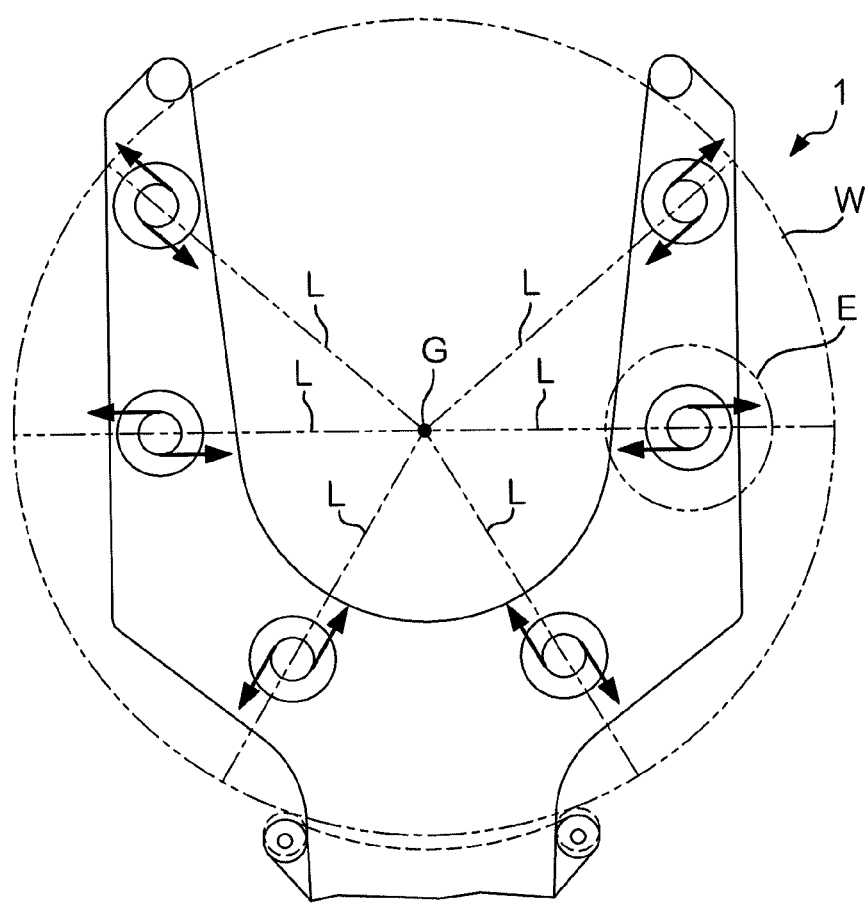
FIG. 7 is a diagram showing directions in which a fluid flows out of swirl flow-forming bodies 2.
Figure 8:
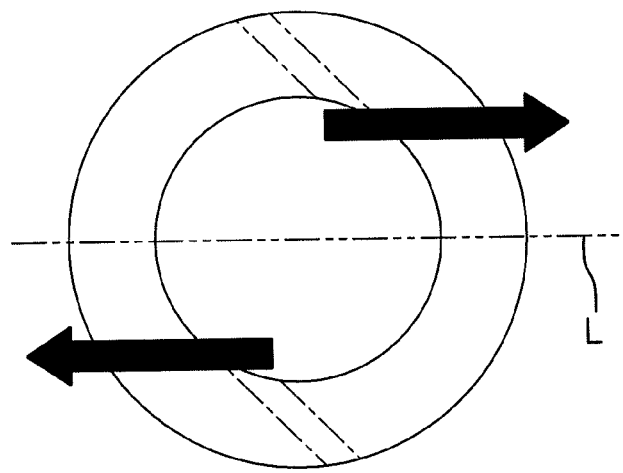
FIG. 8 is an enlarged view of part E shown in FIG. 7.

FIG. 7 is a diagram showing directions in which a fluid flows out of each swirl flow-forming bodies 2 of non-contacting conveyance equipment 1. Specifically, FIG. 7 is a diagram showing directions in which a fluid flows out from the opening of cylindrical chamber 21 of each swirl flow-forming body 2. FIG. 8 is an enlarged view of part E shown in FIG. 7. In the drawings, an arrow shows a direction in which a fluid flows out from the opening of cylindrical chamber 21 of swirl flow-forming body 2. A chain line shows fluid passage 25. Two-dot chain line L shows a line that extends from center of gravity G of plate-like member W in a radial direction, and that crosses the central axis of swirl flow-forming body 2 (or the central axis of a swirl flow formed in cylindrical chamber 21). As shown in the drawings, in non-contacting conveyance equipment 1 according to the present embodiment, fluid passages 25 are arranged so that a fluid flows out in a direction parallel to two-dot chain line L.

It is to be noted that a direction in which a fluid flows out of cylindrical chamber 21 depends on the diameter and depth of cylindrical chamber 21, and a velocity of the fluid. A flow direction of a fluid herein is, for example, a resultant vector of the fluid.

Figure 9:
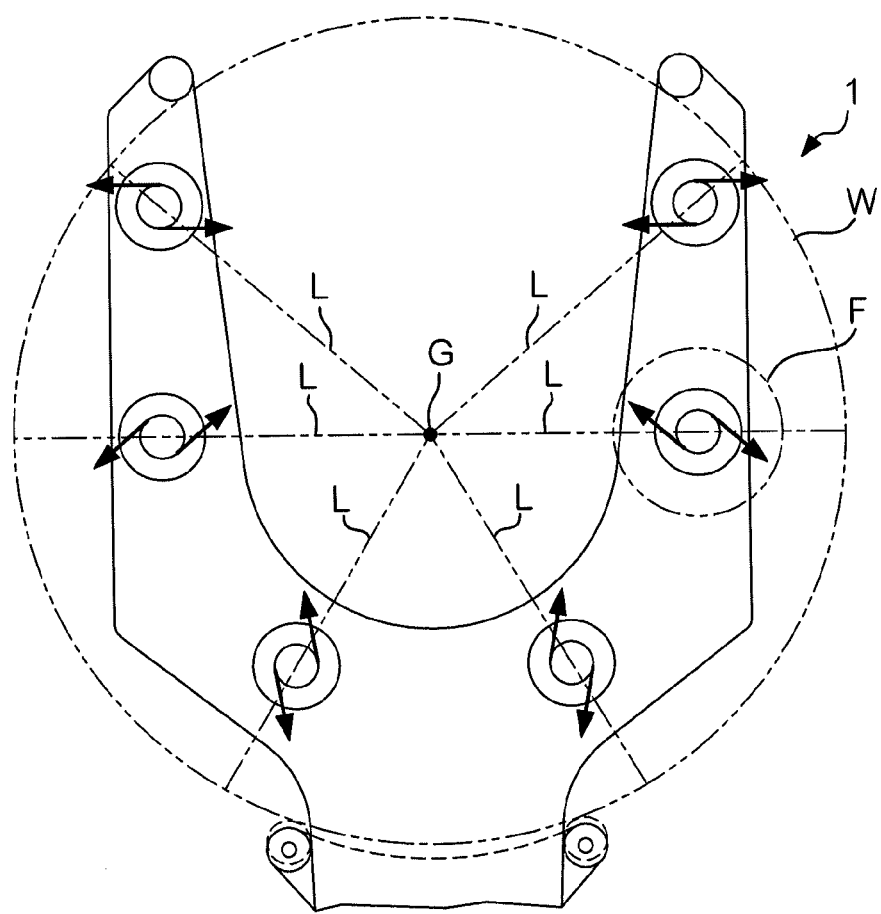
FIG. 9 is a diagram showing directions in which a fluid flows out of swirl flow-forming bodies 2.

In contrast to FIG. 7, FIG. 9 is a diagram showing a case where a fluid flows out in a direction not parallel to two-dot chain line L. As shown in the drawing, in the present case, a direction in which a fluid flows out of each swirl flow-forming body 2 is not parallel to two-dot chain line L; instead, the angle of the direction is approximately 45 degrees to two-dot chain line L.

Figure 10:
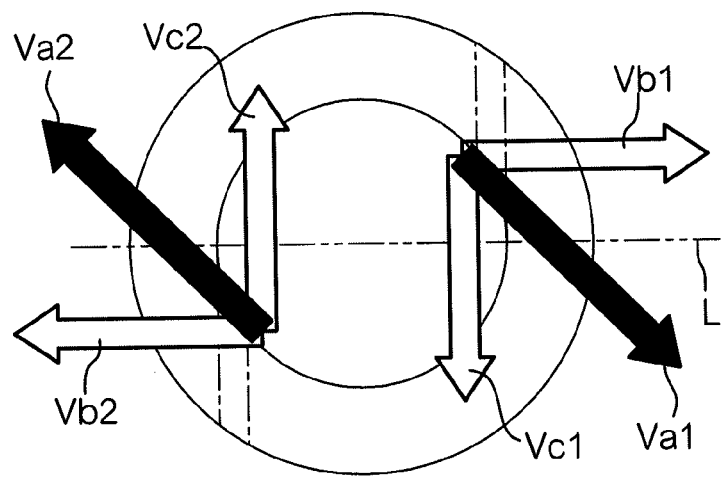
FIG. 10 is an enlarged view of part F shown in FIG. 9.

FIG. 10 is an enlarged view of part F shown in FIG. 9. In the drawing, an arrow showing a direction in which a fluid flows out of cylindrical chamber 21 is denoted as vector Va1. The other arrow is denoted as vector Va2. If vector Va1 is resolved into a vector in a radial direction of plate-like member W and a vector in a tangential direction of plate-like member W, vector Va1 is resolved into vector Vb1 and vector Vc1. If vector Va2 is resolved into a vector in a radial direction of plate-like member W and a vector in a tangential direction of plate-like member W, vector Va2 is resolved into vector Vb2 and vector Vc2. In view of the foregoing, it is understood that in the case shown in FIG. 9, a fluid flowing out of cylindrical chamber 21 applies a force to plate-like member W that causes plate-like member W to rotate in a tangential direction.

Since vector Vc1 and vector Vc2 are opposite to each other, it appears that they cancel each other so that a force is not applied to plate-like member W that causes plate-like member W to rotate. It may be so in theory, but in practice, the two forces may not be balanced with each other in such way that plate-like member W is caused to rotate in either direction. However, in the above case shown in FIG. 7, since a fluid flows out of cylindrical chamber 21 in a direction parallel to a line that extends from the center of gravity of plate-like member W in a radial direction, a force is not applied to plate-like member W that causes plate-like member W to rotate in a tangential direction. Accordingly, rotation of plate-like member W caused by a fluid flowing out is suppressed.

(2) Second Embodiment

Figure 11:
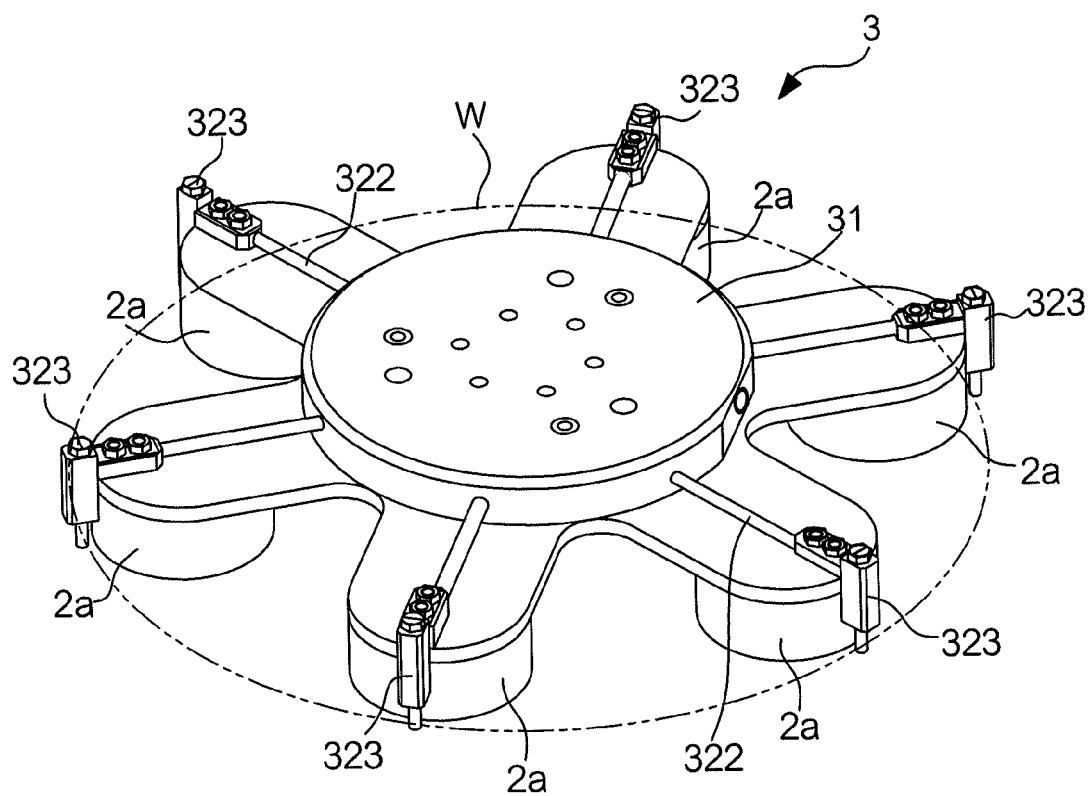
FIG. 11 is a perspective view showing a configuration of non-contacting conveyance equipment 3 according to the second embodiment of the present invention.
Figure 13:
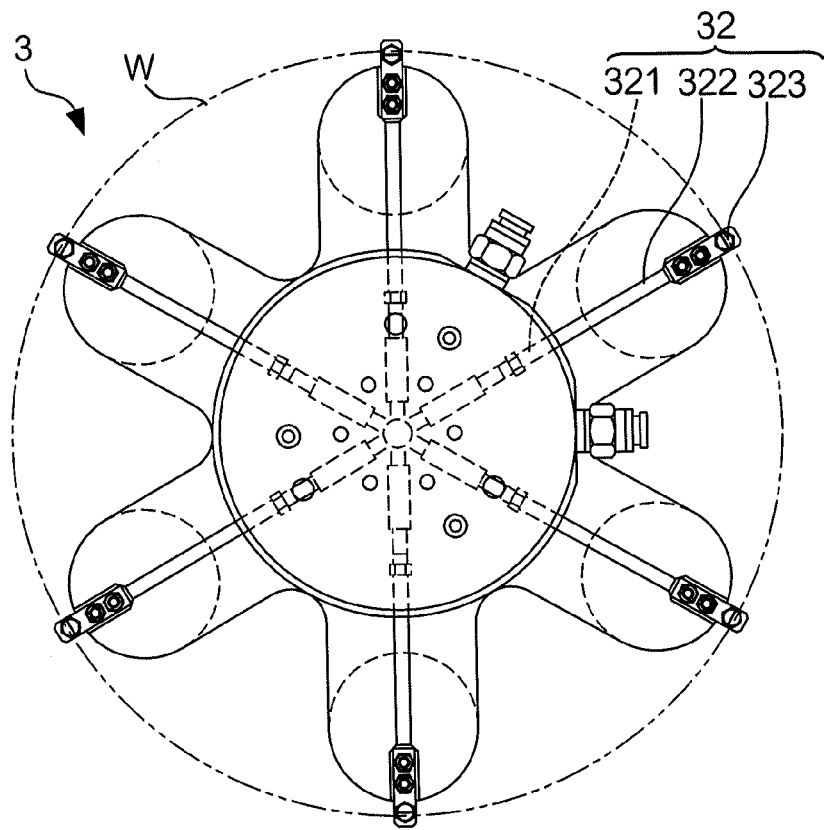
FIG. 13 is a diagram illustrating centering mechanism 32 provided in non-contacting conveyance equipment 3.

FIG. 11 is a perspective view showing a configuration of non-contacting conveyance equipment 3 according to the second embodiment of the present invention. FIG. 12(a) is a top view of non-contacting conveyance equipment 3, FIG. 12(b) is a side view of non-contacting conveyance equipment 3, and FIG. 12(c) is a bottom view of non-contacting conveyance equipment 3. FIG. 13 is a diagram illustrating centering mechanism 32 provided in non-contacting conveyance equipment 3.

In the following description, components shared with the first embodiment will be denoted by like signs, and explanation of the components will be omitted.

Non-contacting conveyance equipment 3 includes: plate-like base part 31; six swirl flow-forming bodies 2a, which are fixed on base part 31 and have a column shape; and centering mechanism 32 for centering plate-like member W. At the external surface of base part 31, fluid supply port 311 is provided, which is connected to fluid introduction ports 24a (see FIG. 15) of each swirl flow-forming body 2a via fluid passages (not shown) formed inside base part 31.

Figure 14:
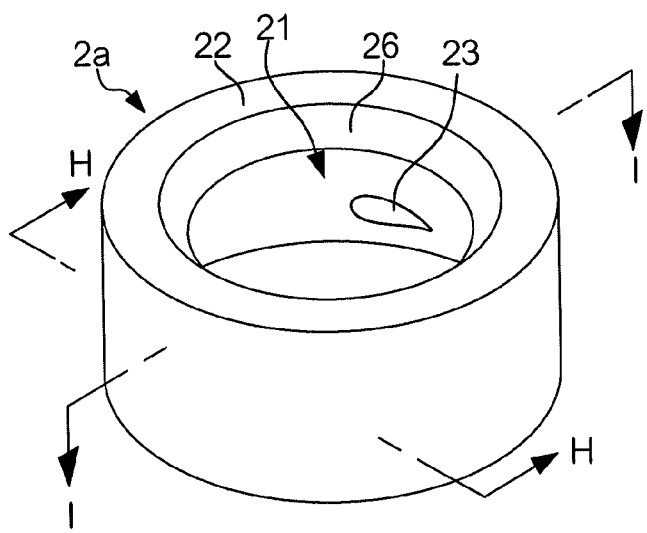
FIG. 14 is a perspective view of a configuration of swirl flow-forming body 2a according to the second embodiment.
Figure 15:
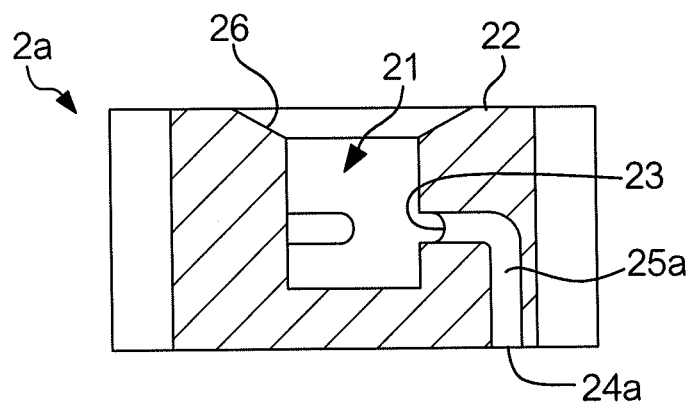
FIG. 15 is a cross-sectional view of swirl flow-forming body 2a along the line H-H of FIG. 14.
Figure 16:
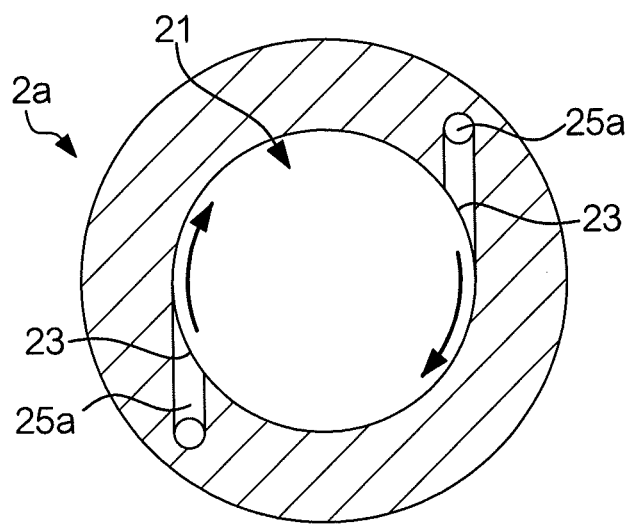
FIG. 16 is a cross-sectional view of swirl flow-forming body 2a along the line I-I of FIG. 14.

FIG. 14 is a perspective view of a configuration of swirl flow-forming body 2a. FIG. 15 is a cross-sectional view of swirl flow-forming body 2a along the line H-H of FIG. 14. FIG. 16 is a cross-sectional view of swirl flow-forming body 2a along the line I-I of FIG. 14. The configuration of swirl flow-forming body 2a according to the present embodiment is similar to that of swirl flow-forming body 2 according to the first embodiment except that in swirl flow-forming body 2 according to the first embodiment, fluid introduction ports 24 are provided at the outer circumferential surface of swirl flow-forming body 2, and fluid passages 25 are straight; whereas in swirl flow-forming body 2a according to the present embodiment, fluid introduction ports 24a are provided at a face opposite end face 22 of swirl flow-forming body 2a, and fluid passages 25a are curved.

A face opposite end face 22 of swirl flow-forming body 2a is fixed on base part 31. A height from base part 31 to end face 22 of each swirl flow-forming body 2a is the same.

Centering mechanism 32 is provided at the outer surface of base part 31, which positions plate-like member W being held in a non-contacting manner, and prevents plate-like member W from falling off from non-contacting conveyance equipment 3. Centering mechanism 32 includes: six cylinders 321, which communicate with each other at one end; bar-shaped link arms 322, each of which is connected to cylinder 321; and bar-shaped centering guides 323, each of which is connected to an end of link arm 322 to which cylinder 321 is not connected. Centering guide 323 is connected to link arm 322 so that centering guide 323 extends in a direction perpendicular to link arm 322.

Since six cylinders 321 communicate with each other at one end, all cylinders 321 can be pressurized or depressurized using one channel of a fluid. When cylinders 321 are depressurized by a fluid supplied from a fluid supply apparatus (not shown); six link arms 322 move toward the center, and concurrently, centering guides 323 move toward the center. When pressure is applied to cylinders 321, six link arms 322 move away from the center; and concurrently, centering guides 323 move away from the center.

In non-contacting conveyance equipment 3 described in the foregoing, when a fluid (for example, air) is supplied via fluid supply port 311 from a fluid supply apparatus (not shown), the fluid is sent to fluid introduction ports 24a of each swirl flow-forming body 2a through fluid passages (not shown) inside base part 31. The fluid sent to fluid introduction ports 24a travels through fluid passage 25a, and is discharged into cylindrical chamber 21 via jetting port 23. The fluid discharged into cylindrical chamber 21 forms a swirl flow and is straightened in cylindrical chamber 21, and thereafter flows out from the opening of cylindrical chamber 21.

In that situation, if plate-like member W is positioned opposite end face 22, flow of outside air into cylindrical chamber 21 is restricted. Also, since a centrifugal force of the swirl flow develops, and entrainment is generated, fluid molecules per unit volume in the center of the swirl flow become less dense: namely, a negative pressure is generated. As a result, plate-like member W is pushed toward end face 22 by surrounding air. On the other hand, as plate-like member W comes close to end face 22, an amount of air flowing out of cylindrical chamber 21 decreases, and a velocity of a fluid discharged into cylindrical chamber 21 through jetting port 23 decreases, so that a pressure in the center of the swirl flow increases. Accordingly, plate-like member W does not come into contact with end face 22, and a given distance is maintained between plate-like member W and end face 22.

In the situation where plate-like member W is held by non-contacting conveyance equipment 3, if cylinders 321 of centering mechanism 32 are depressurized, six link arms 322 move toward the center, and concurrently centering guides 323 move toward the center. Consequently, the outer circumference of plate-like member W is regulated by centering guides 323 (namely, plate-like member W is positioned). On the other hand, if pressure is applied to cylinders 321, six link arms 322 move away from the center, and concurrently, centering guides 323 move away from the center. Consequently, regulation of plate-like member W is terminated.

Figure 17:
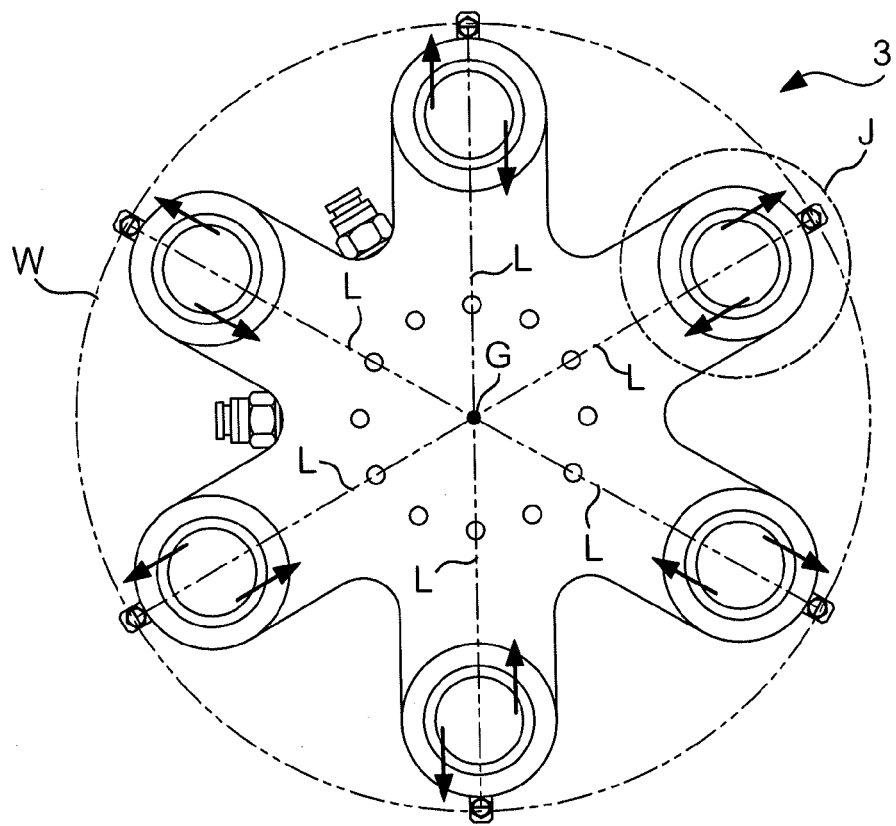
Figure 18:
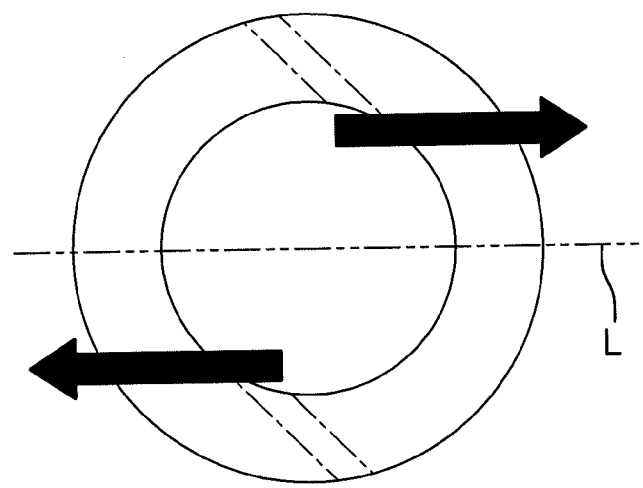
FIG. 18 is an enlarged view of part J shown in FIG. 17.

FIG. 17 is a diagram showing directions in which a fluid flows out of each swirl flow-forming bodies 2a of non-contacting conveyance equipment 1. Specifically, FIG. 17 is a diagram showing directions in which a fluid flows out from the opening of cylindrical chamber 21 of each swirl flow-forming body 2a. FIG. 18 is an enlarged view of part J shown in FIG. 17. In the drawings, an arrow shows a direction in which a fluid flows out from the opening of cylindrical chamber 21 of swirl flow-forming body 2a. A chain line shows fluid passage 25a. Two-dot chain line L shows a line that extends from center of gravity G of plate-like member W in a radial direction, and that crosses the central axis of swirl flow-forming body 2a (or the central axis of a swirl flow formed in cylindrical chamber 21). As shown in the drawings, in non-contacting conveyance equipment 3 according to the present embodiment, fluid passages 25a are arranged so that a fluid flows out in a direction parallel to two-dot chain line L. Accordingly, no force is applied to plate-like member W, which causes plate-like member W to rotate in a tangential direction, so that rotation of plate-like member W caused by a fluid flowing out is suppressed.

(3) Modifications

The above embodiments may be modified as described below. The following modifications may be combined with each other.

(3-1) Modification 1

In the above embodiments, six swirl flow-forming bodies are provided at non-contacting conveyance equipment; however, the number of swirl flow-forming bodies may be other than six as long as the number is equal to or greater than two. In a case where two swirl flow-forming bodies are provided, they may be arranged so that they are opposite each other across the center of gravity of plate-like member W. A swirl flow-forming body may have a rectangular shape, instead of a column shape.

(3-2) Modification 2

In the above embodiments, where a centering mechanism is provided at non-contacting conveyance equipment, the centering mechanism may not be provided. Also, in the first embodiment, centering guides 113 may be omitted.

(3-3) Modification 3

In the above embodiments, two jetting ports and two fluid passages are provided at non-contacting conveyance equipment; however, the number of jetting ports and fluid passages may be one or more than two.

(3-4) Modification 4

In the above embodiments, where it is assumed that plate-like member W has a circular shape, in the present embodiment the shape of plate-like member W may be polygonal. In this case, fluid passages of each swirl flow-forming body are arranged so that a fluid flows out of centering guide 113 in a direction parallel to a line that extends from the center of gravity of plate-like member W toward the outer circumference of the member.

(3-5) Modification 5

In the above embodiments, it is assumed that fluid passages are arranged so that a direction in which a fluid flows out of a cylindrical chamber of each swirl flow-forming body is perfectly parallel to a line that extends from the center of gravity of plate-like member W in a radial direction; however, the direction may not be perfectly parallel to the line. Even in a case where the direction is not perfectly parallel to the line, if the direction is nearly parallel to the line, a force that causes plate-like member W to rotate in a tangential direction decreases so that the object of the present invention of suppressing rotation of plate-like member W is achieved.

(3-6) Modification 6

In the above first embodiment, base body 11 and swirl flow-forming body 2 of non-contacting conveyance equipment 1 may be integrally formed. Similarly, in the above second embodiment, base part 31 and swirl flow-forming body 2a of non-contacting conveyance equipment 3 may be integrally formed.

DESCRIPTION OF REFERENCE NUMERALS

1, 3 . . . Non-contacting conveyance equipment, 2, 2a . . . Swirl flow-forming body, 11 . . . Base body, 12 . . . Holding part, 13, 32 . . . Centering mechanism, 21 . . . Cylindrical chamber, 22 . . . End face, 23 . . . Jetting port, 24, 24a . . . Fluid introduction port, 25, 25a . . . Fluid passage, 26 . . . Slope, 31 . . . Base part, 111 . . . Base part, 112 . . . Arm part, 113, 132, 323 . . . Centering guide, 121, 311 . . . Fluid supply port, 131, 321 . . . Cylinder, 133 . . . Link plate, 322 . . . Link arm, W . . . Plate-like member

The invention claimed is:

1. Non-contacting conveyance equipment for conveying a plate-like member in a non-contacting manner, comprising:
    a plate-like base body; and
    a plurality of swirl flow-forming bodies provided at the base body, wherein each of the plurality of swirl flow-forming bodies includes:
    a column-shaped main body;
    a cylindrical chamber formed inside the main body, that has an opening at one end;
    a flat end face formed at a surface of the main body, on which the cylindrical chamber is opened;
    a jetting port provided at an inner circumferential surface of the cylindrical chamber;
    a fluid introduction port provided at an outer circumferential surface of the main body; and
    a fluid passage that connects the fluid introduction port to the jetting port, wherein the fluid passage is arranged so that a direction in which a fluid flows out of the cylindrical chamber along the end face is substantially parallel to a line that extends from a center of gravity of the plate-like member being conveyed, toward an outer circumference of the plate-like member.

* * * * *